United States Patent
Jeong et al.

(10) Patent No.: US 10,730,233 B2
(45) Date of Patent: Aug. 4, 2020

(54) METHOD FOR MANUFACTURING THREE-DIMENSIONAL STRUCTURE USING NANOIMPRINT METHOD

(71) Applicant: ADMBIOSCIENCE INC., Daejeon (KR)

(72) Inventors: Jun-ho Jeong, Daejeon (KR); So Hee Jeon, Seoul (KR); Junhyuk Choi, Daejeon (KR); Dae-Guen Choi, Sejong-si (KR); Ji Hye Lee, Daejeon (KR); Joo Yun Jung, Daejeon (KR); Eung-Sug Lee, Daejeon (KR)

(73) Assignee: ADMBIOSCIENCE INC., Daejeon (KR)

( * ) Notice: Subject to any disclaimer, the term of this patent is extended or adjusted under 35 U.S.C. 154(b) by 0 days.

(21) Appl. No.: 16/093,655

(22) PCT Filed: Apr. 14, 2017

(86) PCT No.: PCT/KR2017/004082
§ 371 (c)(1),
(2) Date: Oct. 15, 2018

(87) PCT Pub. No.: WO2017/179955
PCT Pub. Date: Oct. 19, 2017

(65) Prior Publication Data
US 2019/0070775 A1    Mar. 7, 2019

(30) Foreign Application Priority Data

Apr. 15, 2016 (KR) .................. 10-2016-0046280

(51) Int. Cl.
*B29C 64/147* (2017.01)
*G03F 7/00* (2006.01)
(Continued)

(52) U.S. Cl.
CPC ........ *B29C 64/147* (2017.08); *B29C 33/3842* (2013.01); *B29C 33/60* (2013.01);
(Continued)

(58) Field of Classification Search
USPC ....... 156/230, 232, 234, 235, 239, 240, 247, 156/249, 289
See application file for complete search history.

(56) References Cited

U.S. PATENT DOCUMENTS 9,065,010 B2 * 6/2015 Forrest ................ H01L 27/1446
2002/0015897 A1 * 2/2002 Toshine ............... G03H 1/0252
430/2

(Continued)

FOREIGN PATENT DOCUMENTS

KR    10-2000-0054896 A    9/2000
KR       10-0678537 B1     2/2007
(Continued)

OTHER PUBLICATIONS

International Search Report for PCT/KR2017/004082 dated Aug. 11, 2017 from Korean Intellectual Property Office.

*Primary Examiner* — Sing P Chan
(74) *Attorney, Agent, or Firm* — Revolution IP, PLLC

(57) ABSTRACT

A method for manufacturing a three-dimensional structure through nano-imprinting, includes: a stamp preparation step in which a stamp formed with a convex-concave portion corresponding to a pattern of functional layers to be formed is prepared; a material formation step in which at least one material for forming the functional layers is formed to a thickness of several to dozens of nanometers on the convex-concave portion; a material stacking step in which the material formed on the convex-concave portion is stacked on a substrate; and a functional layer securing step in which the material is cured by applying pressure, heat and pressure,
(Continued)

or light and pressure thereto such that the material can be converted into the functional layers.

9 Claims, 7 Drawing Sheets

(51) Int. Cl.
  *B29C 41/00*  (2006.01)
  *B29C 33/60*  (2006.01)
  *B29C 64/291*  (2017.01)
  *B29C 33/38*  (2006.01)
  *B29C 64/245*  (2017.01)
  *B29C 64/188*  (2017.01)
  *B29C 64/314*  (2017.01)
  *G03F 9/00*  (2006.01)
  *G03F 7/20*  (2006.01)
(52) U.S. Cl.
  CPC ............ *B29C 41/00* (2013.01); *B29C 64/188* (2017.08); *B29C 64/245* (2017.08); *B29C 64/291* (2017.08); *B29C 64/314* (2017.08); *G03F 7/0002* (2013.01); *G03F 7/0037* (2013.01)

(56) References Cited

U.S. PATENT DOCUMENTS

| | | | |
|---|---|---|---|
| 2009/0206520 A1* | 8/2009 | Park | B82Y 10/00 264/401 |
| 2010/0314253 A1* | 12/2010 | Shimada | C25D 1/10 205/70 |
| 2012/0048184 A1* | 3/2012 | Lee | C08G 79/00 118/264 |
| 2012/0313241 A1* | 12/2012 | Bower | H01L 21/563 257/737 |
| 2013/0220971 A1* | 8/2013 | Bijkerk | B82Y 10/00 216/24 |
| 2017/0048976 A1* | 2/2017 | Prevatte | H01L 24/08 |
| 2018/0305567 A1* | 10/2018 | Verschuuren | C09D 11/00 |
| 2019/0070775 A1* | 3/2019 | Jeong | B29C 64/147 |

FOREIGN PATENT DOCUMENTS

| | | |
|---|---|---|
| KR | 10-2010-0050699 A | 5/2010 |
| KR | 10-2010-0107634 A | 10/2010 |
| KR | 10-2011-0000084 A | 1/2011 |
| KR | 10-2015-0049776 A | 5/2015 |

\* cited by examiner

[FIG. 1]
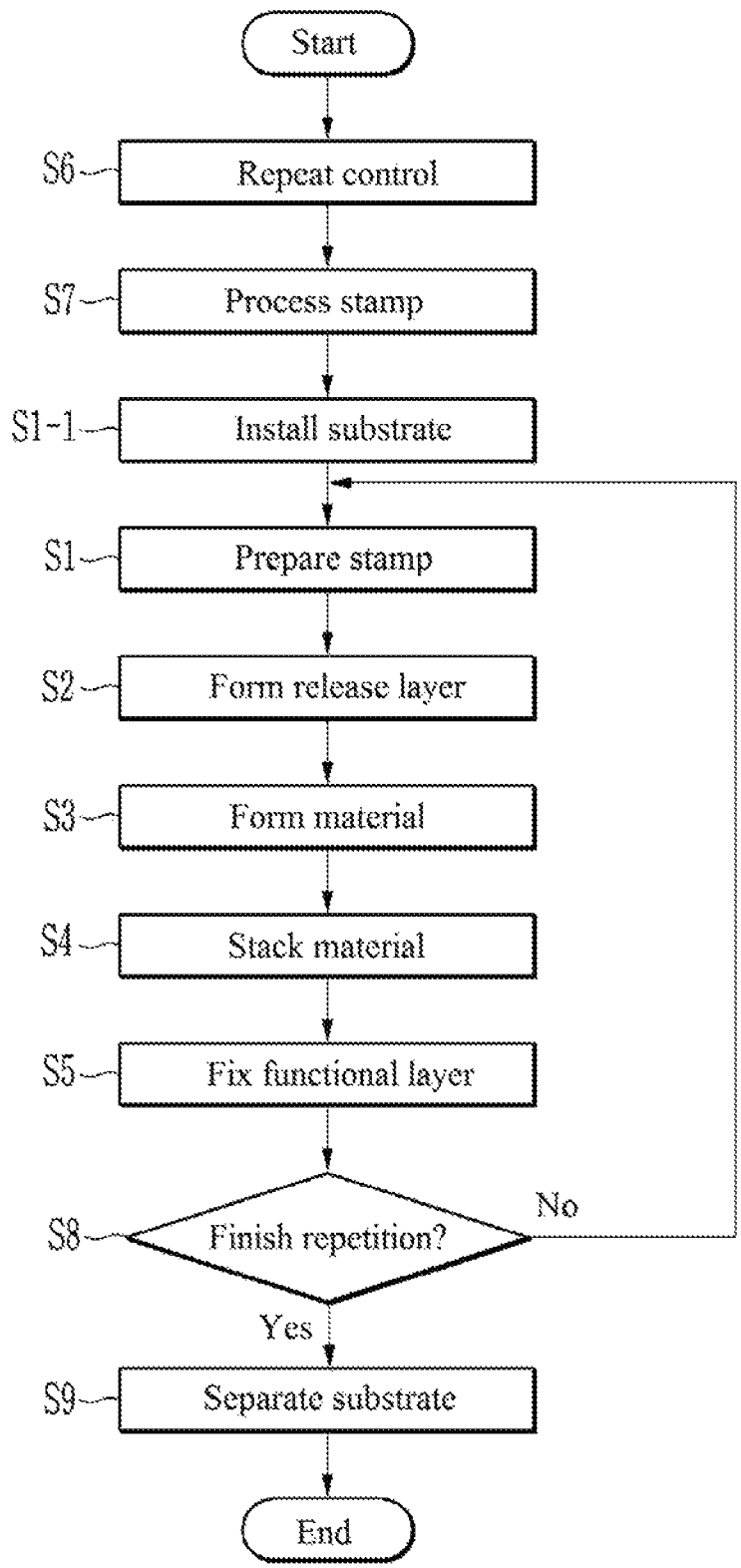

[FIG. 2]
(a)
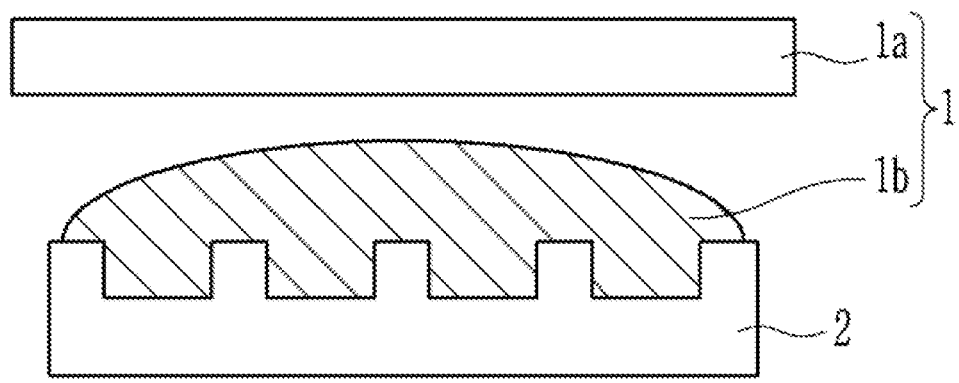
(b)
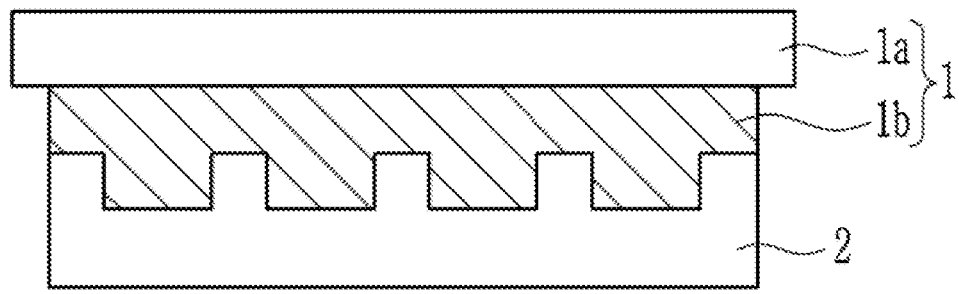
(c)
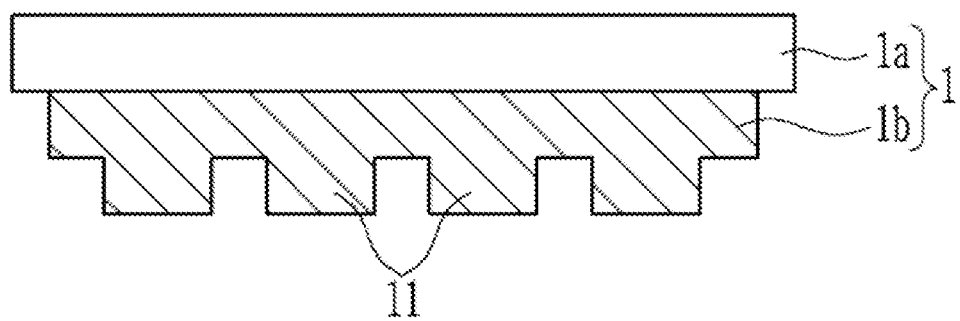

【FIG. 3】
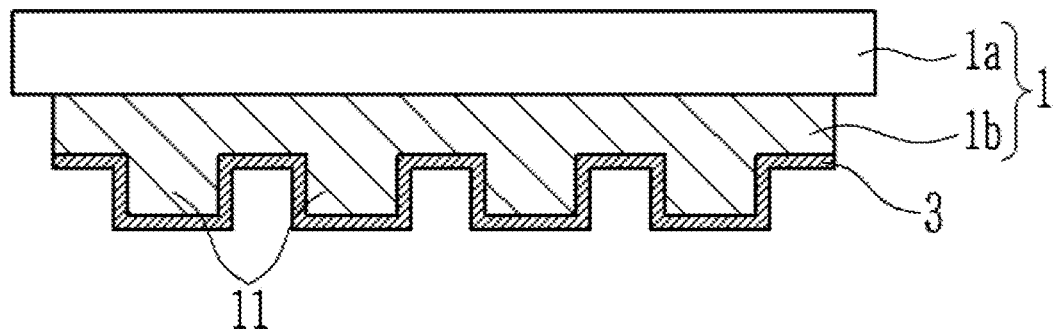
【FIG. 4】
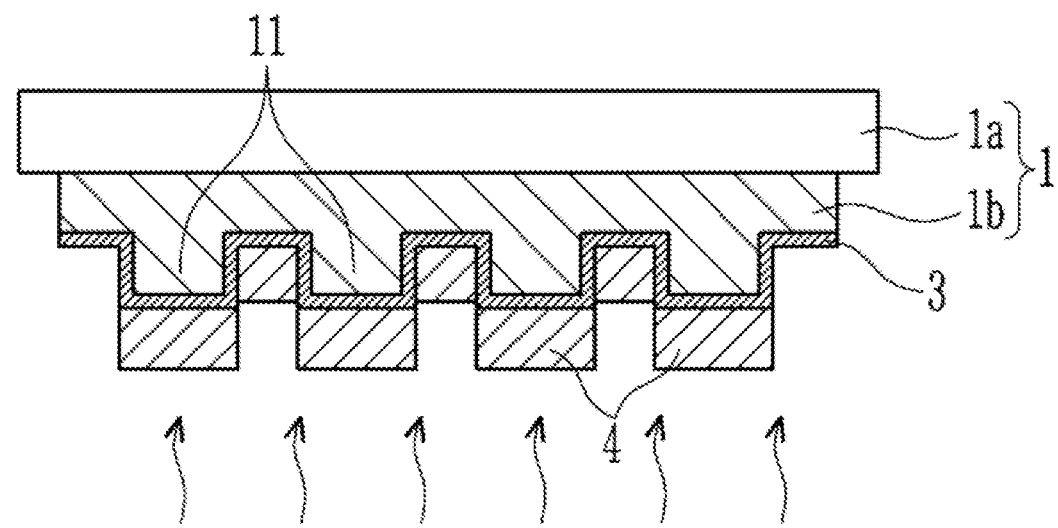

[FIG. 5]
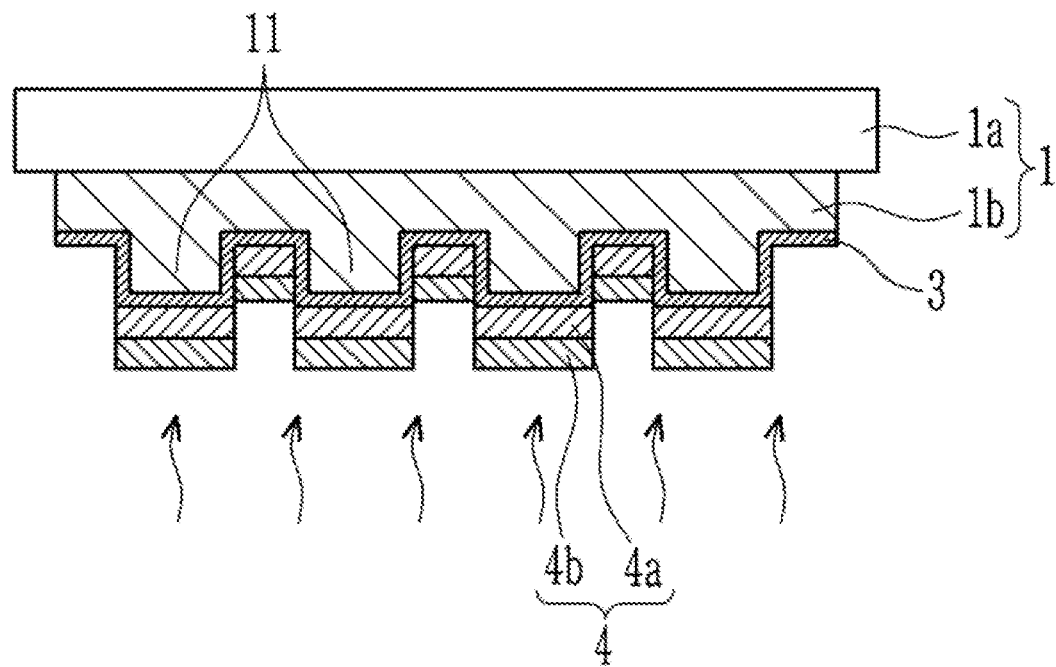
[FIG. 6]
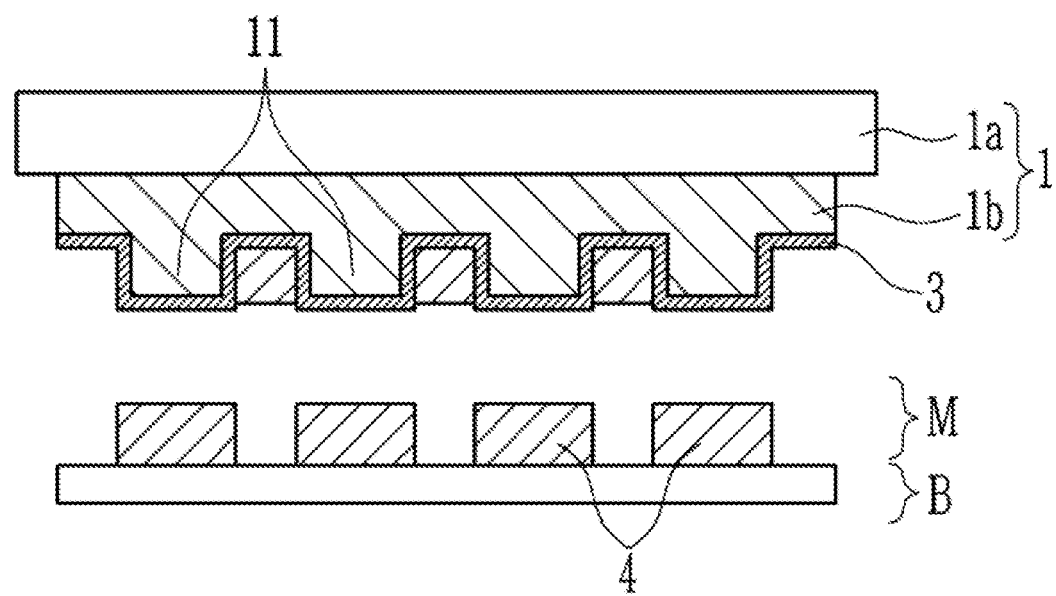

[FIG. 7]
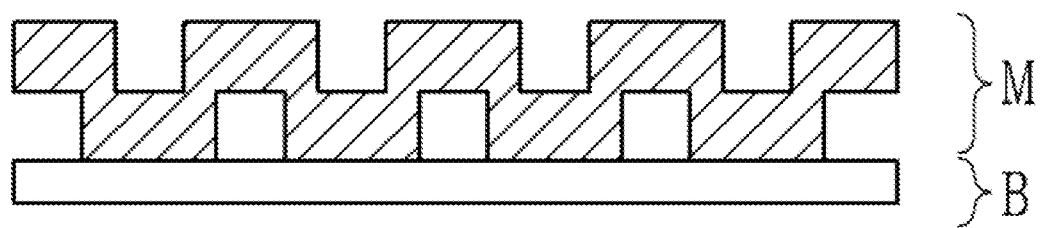
[FIG. 8]
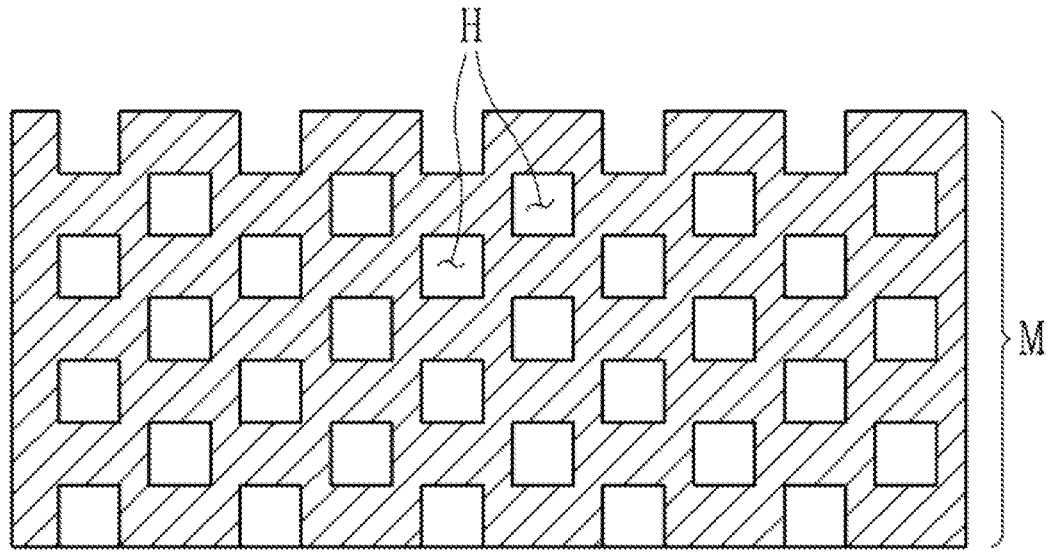

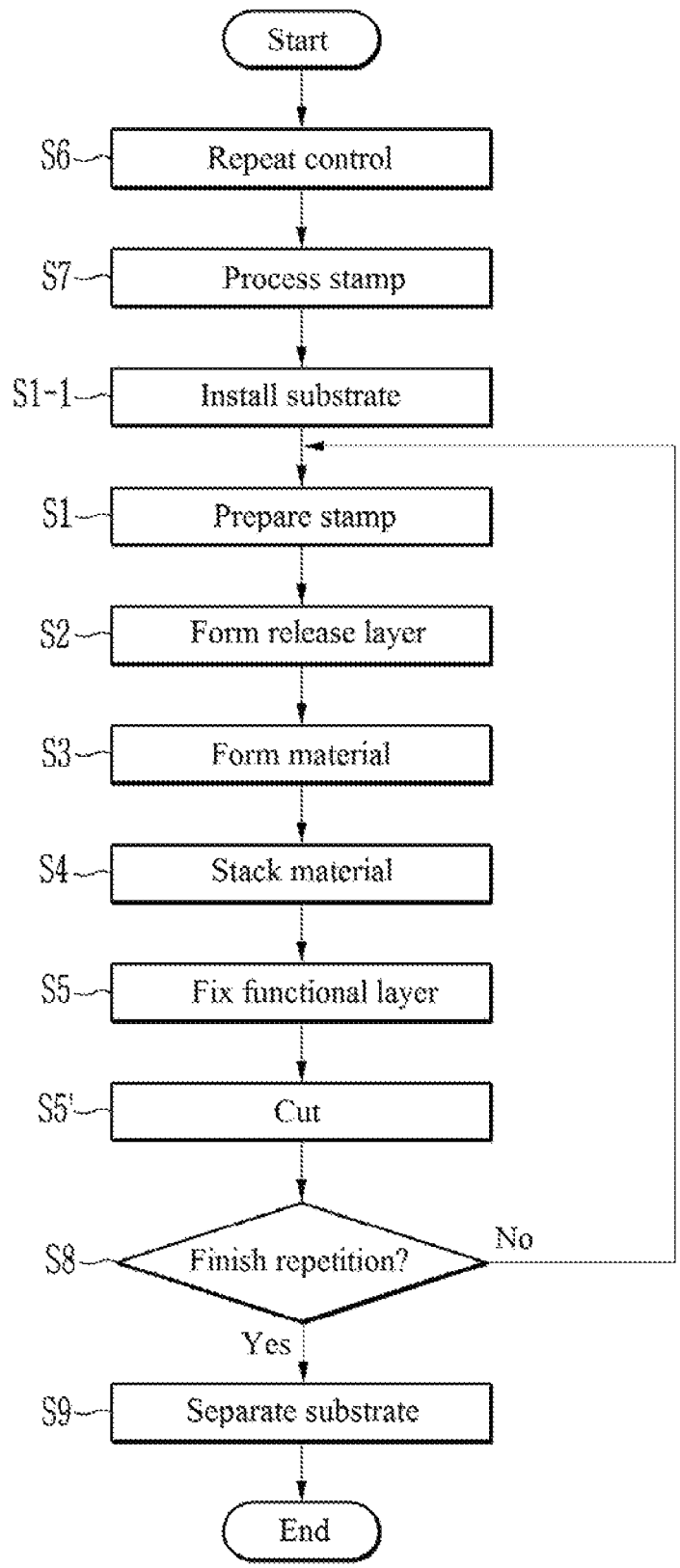
[FIG. 9]

【FIG. 10】
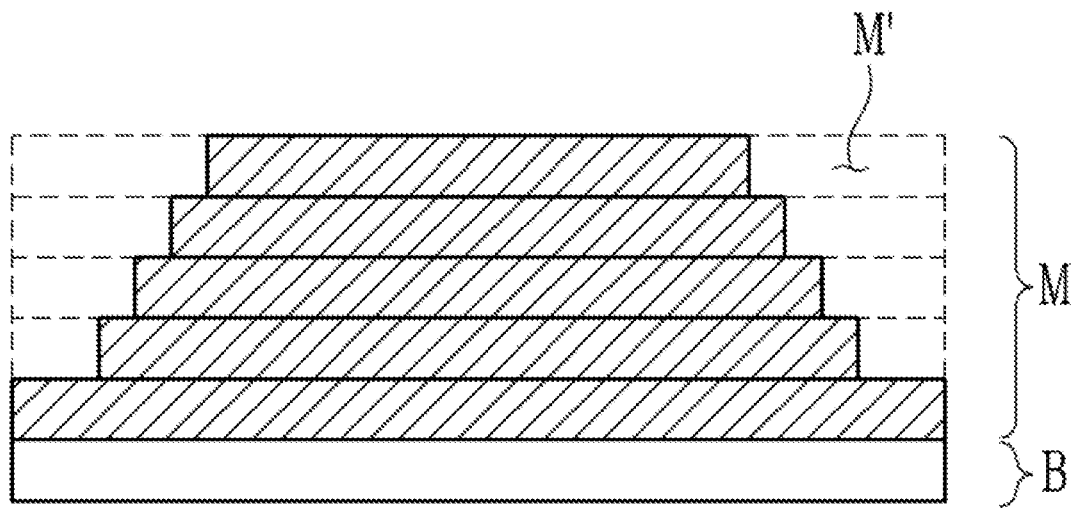
【FIG. 11】
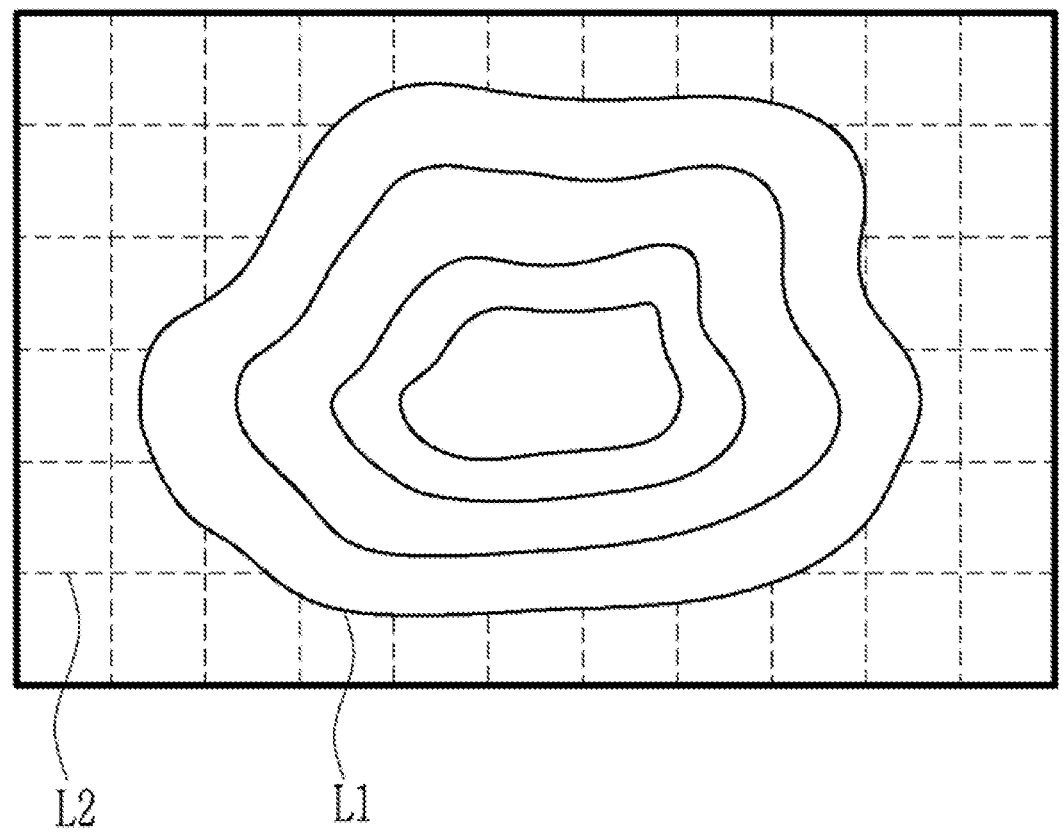

METHOD FOR MANUFACTURING THREE-DIMENSIONAL STRUCTURE USING NANOIMPRINT METHOD

TECHNICAL FIELD

The present invention relates to a method for manufacturing a three-dimensional structure through nano-imprinting, and more particularly to a method for manufacturing a three-dimensional structure through nano-imprinting, which allows easy formation of a high strength, ultra-lightweight, highly functional three-dimensional structure by stacking a plurality of functional layers patterned to a thickness of several to dozens of nanometers through nano-imprinting.

BACKGROUND ART

Generally, in order to manufacture a three-dimensional structure, a mold for shaping the three-dimensional structure is manufactured. To this end, a wooden pattern is manufactured and the mold for the three-dimensional structure is manufactured using the wooden pattern through several processes.

In order to manufacture the mold for the three-dimensional structure, a rapid prototyping process may be used. Here, the rapid prototyping process refers to direct formation of a three-dimensional prototype based on three-dimensional CAD data using materials such as paper, wax, ABS and plastics without a mold. Recently, a rapid prototyping process using metal powder and wire is developed in the art.

Korean Patent Laid-open Publication No. 2000-0054896 (Laid-open Date: 2000 Sep. 5) discloses a technique for manufacturing a prototype having a desired shape by forming a shape portion on each thin metal plate, stacking the thin metal plates each having the shape portion one above another, and welding the metal plates to each other using a welding roller.

However, such a conventional method for manufacturing a three-dimensional structure has a limit in thickness reduction of the metal plates and encounters difficulty in winding the metal plates around a roller when the metal plates have a small thickness of several to dozens of nanometers. In addition, the conventional method has difficulty in formation of a complex shape portion on the metal plate having a thickness of several to dozens of nanometers and in manufacture of a high strength ultra-lightweight three-dimensional structure having various holes therein.

DISCLOSURE

Technical Problem

It is an aspect of the present invention to provide a method for manufacturing a three-dimensional structure through nano-imprinting, which allows easy formation of a high strength, ultra-lightweight, highly functional three-dimensional structure by stacking a plurality of functional layers patterned to a thickness of several to dozens of nanometers by the nanoimprint method.

Technical Solution

In accordance with one embodiment of the present invention, a method for manufacturing a three-dimensional structure through nano-imprinting includes: a stamp preparation step in which a stamp formed with a convex-concave portion corresponding to a pattern of functional layers to be formed is prepared; a release layer formation step in which a release layer is formed on the stamp having the convex-concave portion; a material formation step in which at least one material for forming the functional layers is formed to a thickness of several to dozens of nanometers on the convex-concave portion subjected to the release layer formation step; a material stacking step in which the material formed on the convex-concave portion is stacked on a substrate; and a functional layer securing step in which the material at an upper side is bonded to the material at a lower side by applying at least one of pressure, a combination of heat and pressure and a combination of light and pressure to the materials, wherein the stamp preparation step, the release layer formation step, the material formation step, the material stacking step, and the functional layer securing step are sequentially repeated corresponding to a stack structure of the functional layers.

The method may further include a cutting step in which the functional layers are cut, after the functional layer securing step.

The method may further include: a repetition controlling step in which the kind of pattern is determined corresponding to the stack structure of the functional layers and the number of sequential repetitions is determined; and a stamp processing step in which the convex-concave portion is formed on the stamp corresponding to the pattern determined in the repetition controlling step.

The method may further include a repetition finishing step in which, whether the number of sequential repetitions is finished or not is selected, after the functional layer securing step, wherein, if the number of sequential repetitions is not finished, the method returns to the stamp preparation step.

The method may further include a release layer formation step in which a release layer is formed on a surface of the stamp, before the material formation step.

The method may further include a substrate installation step in which the substrate is prepared to allow an initial functional layer to be detachably attached thereto, before the material formation step; and a substrate separation step in which the functional layers are separated from the substrate, after all of the functional layers are stacked and secured corresponding to the stacked structure of the functional layers.

The stamp may be formed of an organic material, an inorganic material or a composite of organic/inorganic materials and include a remaining layer on which the convex-concave portion is formed, and the material for forming the functional layers may be composed of materials at upper and lower sides such that the material at the upper side is bonded to the material at the lower side upon application of at least one of pressure, a combination of heat and pressure and a combination of light and pressure thereto.

The convex-concave portion may be formed on the surface of the stamp in at least one shape selected from the group consisting of a line shape, an island shape, a lattice shape, and a combination thereof.

In the material formation step, the material may be formed on the convex-concave portion by at least one of chemical vapor deposition, physical vapor deposition, sputtering, spray printing, inkjet printing, and screen printing.

The stamp may be formed of a transparent material and, in the functional layer securing step, the material may be irradiated with UV light or visible light having passed through the stamp such that the material at an upper side is bonded to the material at a lower side, while the stamp compresses the materials so as to maintain a stacked structure of the materials.

A three-dimensional structure formed by the method according to the present invention may be applied to any one of an ultra-lightweight high strength metal complex material, a water treatment filter, an air purification filter, a construction interior/exterior material, a structural color material, and a hologram material.

Advantageous Effects

According to embodiments of the present invention, the manufacturing method allows easy formation of a high strength, ultra-lightweight, highly functional three-dimensional structure by stacking a plurality of functional layers patterned to a thickness of several to dozens of nanometers by the nanoimprint method.

In addition, the manufacturing method according to the present invention allows materials to be formed in a nanometer scale on a stamp, thereby allowing easy patterning of the functional layers while preventing sagging or distortion of the patterns on the functional layers.

Further, the manufacturing method according to the present invention can improve accuracy of the pattern formed on the functional layers and can facilitate stacking and bonding between the functional layers having patterns thereon.

Further, the manufacturing method according to the present invention allows change of a stacked structure of the functional layers in various ways depending upon the kind of pattern to be determined and can improve structural accuracy of the functional layers.

Further, the manufacturing method according to the present invention allows stable separation of the materials from the stamp and integration of the stacked materials, thereby enabling stable formation of the functional layers.

Further, the manufacturing method according to the present invention can prevent contamination of the materials by the stamp and deformation or damage to the stamp due to repeated use of the stamp.

Further, the manufacturing method according to the present invention can allow easy attachment or detachment between the substrate and the functional layers while allowing stable separation of the functional layers from the substrate without damage to the functional layers, thereby stabilizing a stacked structure of the three-dimensional structure.

Further, the manufacturing method according to the present invention can enhance bonding strength between materials stacked one above another by at least one of pressure, a combination of heat and pressure and a combination of light and pressure and can improve strength and conductivity (electrical or thermal conductivity) of a completed three-dimensional structure.

Further, the manufacturing method according to the present invention can allow stable attachment of the materials to the convex-concave portion of the stamp and stable adjustment of thicknesses of the materials attached to the convex-concave portion.

Further, the manufacturing method according to the present invention can provide fine filtering effects to the three-dimensional structure while reducing the weight of the three-dimensional structure through holes formed in the functional layers stacked one above another, and can allow the completed three-dimensional structure to exhibit inherent optical characteristics thereof.

Further, the manufacturing method according to the present invention can realize a mechanical or electromagnetic metamaterial through the three-dimensional structure.

DESCRIPTION OF DRAWINGS

FIG. 1 is a flowchart of a method for manufacturing a three-dimensional structure through nano-imprinting according to one embodiment of the present invention.

FIG. 2 is a flow diagram of a stamp manufacturing process in the method for manufacturing a three-dimensional structure through nano-imprinting according to the embodiment of the present invention.

FIG. 3 shows a release layer formed in the method for manufacturing a three-dimensional structure through nano-imprinting according to the embodiment of the present invention.

FIG. 4 shows a material for a functional layer formed on a stamp in the method for manufacturing a three-dimensional structure through nano-imprinting according to the embodiment of the present invention.

FIG. 5 shows modification of the material for the functional layer formed on the stamp in the method for manufacturing a three-dimensional structure through nano-imprinting according to the embodiment of the present invention.

FIG. 6 shows the functional layer separated from the stamp and stacked on substrate in the method for manufacturing a three-dimensional structure through nano-imprinting according to the embodiment of the present invention.

FIG. 7 shows functional layers bonded to each other by at least one of pressure, a combination of heat and pressure and a combination of light and pressure in the method for manufacturing a three-dimensional structure through nano-imprinting according to the embodiment of the present invention.

FIG. 8 shows a stacked structure of the functional layers in the method for manufacturing a three-dimensional structure through nano-imprinting according to the embodiment of the present invention.

FIG. 9 is a flowchart of a cutting step in a method for manufacturing a three-dimensional structure through nano-imprinting according to another embodiment of the present invention.

FIG. 10 and FIG. 11 show the cutting step in the method for manufacturing a three-dimensional structure through nano-imprinting according to another embodiment of the present invention.

BEST MODE

Hereinafter, embodiments of the present invention will be described with reference to the accompanying drawings. It should be understood that the present invention is not limited to the following embodiments and may be embodied in different ways.

In the drawings, portions irrelevant to the description will be omitted for clarity. Like components will be denoted by like reference numerals throughout the specification.

It will be understood that when an element is referred to as being "connected to" another element, it can be directly connected to the other element, or intervening elements may also be present. In addition, it will be understood that the terms "includes", "comprises", "including" and/or "comprising," when used in this specification, specify the presence of stated features, steps, operations, elements, and/or components, but do not preclude the presence or addition of one or more other features, steps, operations, elements, components, and/or groups.

It will be understood that when an element such as a layer, film, region or substrate is referred to as being placed "above"/"below" or "on"/"under" another element, it can be directly placed on the other element, or intervening layer(s) may also be present. In addition, spatially relative terms, such as "above," "upper (portion)," "upper surface," and the like may be understood as meaning "below," "lower (portion)," "lower surface," and the like according to a reference orientation. In other words, the expressions of spatial orientations are to be construed as indicating relative orientations instead of absolute orientations (that is, orientations with respect to the direction of gravity).

FIG. 1 is a flowchart of a method for manufacturing a three-dimensional structure through nano-imprinting according to one embodiment of the present invention, FIG. 2 is a flow diagram of a stamp manufacturing process in the method for manufacturing a three-dimensional structure through nano-imprinting according to the embodiment of the present invention, FIG. 3 shows a release layer formed in the method for manufacturing a three-dimensional structure through nano-imprinting according to the embodiment of the present invention, FIG. 4 shows a material for a functional layer formed on a stamp in the method for manufacturing a three-dimensional structure through nano-imprinting according to the embodiment of the present invention, FIG. 5 shows modification of the material for the functional layer formed on the stamp in the method for manufacturing a three-dimensional structure through nano-imprinting according to the embodiment of the present invention, FIG. 6 shows the functional layer separated from the stamp and stacked on the substrate in the method for manufacturing a three-dimensional structure through nano-imprinting according to the embodiment of the present invention, FIG. 7 shows functional layers bonded to each other by at least one of pressure, a combination of heat and pressure and a combination of light and pressure in the method for manufacturing a three-dimensional structure through nano-imprinting according to the embodiment of the present invention, and FIG. 8 shows a stacked structure of the functional layers in the method for manufacturing a three-dimensional structure through nano-imprinting according to the embodiment of the present invention.

Referring to FIG. 1 to FIG. 8, the method for manufacturing a three-dimensional structure through nano-imprinting according to one embodiment of the present invention is a method that allows easy formation of a high strength, ultra-lightweight, highly functional three-dimensional structure by stacking a material for forming functional layers M patterned to a thickness of several to dozens of nanometers through nano-imprinting, and includes a stamp preparation step S1, a release layer formation step S2, a material formation step S3, a material stacking step S4, and a functional layer securing step S5. Here, the stamp preparation step S1 to the functional layer securing step S5 are sequentially repeated corresponding to a stacked structure of the functional layers M. In other words, the stamp preparation step S1, the release layer formation step S2, the material formation step S3, the material stacking step S4, and the functional layer securing step S5 are sequentially repeated corresponding to the stacked structure of the functional layers M, thereby forming a three-dimensional structure having a desired size.

In the stamp preparation step S1, a stamp 1 formed with a convex-concave portion 11 corresponding to a pattern of the functional layers M to be formed is prepared. The convex-concave portion 11 may be formed on the stamp 1 by a stamp processing step S7 described below.

Here, the stamp 1 is formed of an organic material, an inorganic material or a composite of organic/inorganic materials and may serve to allow stable formation of a material 4 in the functional layer securing step S5.

The release layer formation step S2 is performed prior to the material formation step S3. In the release layer formation step S2, a release layer 3 is formed on the stamp 1 including the convex-concave portion 11. In the release layer formation step S2, the release layer 3 may be formed on a surface of the stamp 1 including the convex-concave portion 11 by at least one of chemical vapor deposition, physical vapor deposition, sputtering, spray printing, inkjet printing, and screen printing.

The release layer 3 can facilitate attachment or detachment of the material 4. The release layer formation step S2 allows the material 4 for formation of the functional layers M to be stably attached to or detached from the convex-concave portion 11 of the stamp 1. Here, the release layer 3 may be formed of any material without limitation and is formed on the surface of the stamp 1 to facilitate attachment or detachment of the material 4 or the functional layers M.

By way of example, the release layer formation step S2 may be performed prior to the material formation step S3 to form the release layer 3 on the surface of the stamp 1 formed with the convex-concave portion 11, and the material formation step S3 may be performed after the release layer formation step S2, thereby allowing the release layer 3 to be permanently, semi-permanently or temporarily maintained on the stamp 1 formed with the convex-concave portion 11.

In the material formation step S3, the material 4 for formation of the functional layers M is formed on the convex-concave portion 11 subjected to the release layer formation step S2. In the material formation step S3, the material 4 is formed to a thickness of several to dozens of nanometers on the convex-concave portion 11. For example, the material 4 may be formed to a thickness of 1 nanometer to 100 nanometers on the convex-concave portion 11.

In the material formation step S3, one or more materials 4 may be formed on the convex-concave portion 11 subjected to the release layer formation step S2. In this embodiment, the material 4 may be composed of a first material 4a and a second material 4b different from the first material 4a. In the material formation step S3, the first material 4a may be formed on the convex-concave portion 11 and the second material 4b may be formed on the first material 4a. Although the material formation step S3 is described as forming two materials 4 on the convex-concave portion 11 in this embodiment, it should be understood that the present invention is not limited thereto. In alternative embodiments, the material formation step S3 allows three or more materials 4 to be formed on the convex-concave portion 11 or allows two or more materials 4 to be alternately formed thereon.

Here, the materials 4 can be detachably attached to the convex-concave portion 11 by the release layer formation step S2 and thus can be stably transferred to a substrate B described below.

The materials 4 may be composed of a conductive material, such as gold, silver, platinum, and the like. Alternative, the materials 4 may be composed of an organic material or an inorganic material. Accordingly, the materials 4 can realize a mechanical or electromagnetic metamaterial.

In the material formation step S3, the materials 4 may be formed on the convex-concave portion 11 by one of chemical vapor deposition, physical vapor deposition, sputtering, spray printing, inkjet printing, and screen printing.

In the material stacking step S4, the material 4 formed on the convex-concave portion 11 is stacked on the substrate B.

Bonding strength between the stamp 1 and the material 4 is determined by the release layer formation step S2 described below and bonding strength between the substrate B and the material 4 is determined by the substrate installation step S1-1 described below. Here, bonding strength between the stamp 1 and the material 4 may be set to be lower than bonding strength between the substrate B and the material 4 to allow the materials 4 to be stably separated from the stamp 1 while enhancing bonding strength between the material 4 and the substrate B.

In the functional layer securing step S5, the material 4 at an upper side is bonded to the material 4 at a lower side by applying at least one of pressure, a combination of heat and pressure and a combination of light and pressure to the materials 4 such that the materials 4 form the functional layers M. Here, pressure may be applied to the materials 4 toward the substrate B using the stamp 1. For example, in the functional layer securing step S5, the functional layers M may be formed through plasmonic welding of the material 4 using UV light or visible light. Further, in the functional layer securing step S5, the functional layers M may be formed on the substrate B by applying heat and pressure to the materials 4.

In one example, the stamp 1 may be formed of a transparent material and, in the functional layer securing step S5, the materials 4 are irradiated with UV light or visible light having passed through the stamp 1, with the materials 4 compressed by the stamp 1 to maintain a stacked structure of the materials 4, such that the material 4 at the upper side can be bonded to the material 4 at the lower side, thereby forming the functional layers M integrated with each other.

In another example, the stamp 1 may be formed of a translucent or opaque material and, in the functional layer securing step S5, heat is applied to the materials 4, with the materials 4 compressed by the stamp 1 to maintain the stacked structure of the materials 4, such that the material 4 at the upper side can be bonded to the material 4 at the lower side, thereby forming the functional layers M integrated with each other.

By the functional layer securing step S5, the materials 4 can be stably bonded to the substrate B. In addition, the functional layers M stacked one above another can be integrated with each other by the functional layer securing step S5.

The method for manufacturing a three-dimensional structure through nano-imprinting according to the embodiment of the invention may further include a repetition controlling step S6 and a stamp processing step S7.

In the repetition controlling step S6, the kind of pattern is determined corresponding to the stacked structure of the functional layers M. In addition, in the repetition controlling step S6, the number of sequential repetitions for stacking the functional layers M is determined corresponding to the stacked structure of the functional layers M. Accordingly, the repetition controlling step S6 may determine the shape of the functional layers M to be formed and a stacked structure of the three-dimensional structure to be completed.

In the stamp processing step S7, the convex-concave portion 11 is formed on the stamp 1 corresponding to the pattern determined in the repetition controlling step S6. In the stamp processing step S7, the stamp 1 is provided in plural depending upon the kind of pattern selected in the repetition controlling step S6 such that each of the stamps 1 can form one kind of pattern.

Here, the stamp 1 may include a base 1a and a remaining layer 1b stacked on the base 1a, with the convex-concave portion 11 formed on the remaining layer 1b. Each of the base 1a and the remaining layer 1b may be formed of a transparent, translucent or opaque organic or inorganic material, or a composite of organic/inorganic materials. When the base 1a and the remaining layer 1b are formed of transparent materials, the base 1a and the remaining layer 1b allow transmission of UV light or visible therethrough to stabilize the functional layers in the functional layer securing step S5.

Here, the convex-concave portion 11 on the stamp 1 is also formed in a nanometer scale, thereby miniaturizing the material 4.

In the stamp processing step S7, a liquid thermosetting or photocurable resin is deposited on a master 2 having a pattern corresponding to the pattern of the functional layers M, and the remaining layer 1b and the convex-concave portion 11 are cured with light while flattening the resin using the base 1a. Then, the stamp 1 is separated from the master 2, thereby forming the stamp 1 in which the base 1a, the remaining layer 1b and the convex-concave portion 11 are integrated. The convex-concave portion 11 may have any one of a line shape, an island shape and a combination thereof on the surface of the stamp 1.

Then, the stamp preparation step S1 to the functional layer securing step S5 are sequentially repeated according to the number of sequential repetitions determined in the repetition controlling step S6, thereby completing the stacked structure of the functional layers M and the stacked structure of the three-dimensional structure.

The method for manufacturing a three-dimensional structure through nano-imprinting according to the embodiment may further include a repetition finishing step S8.

The repetition finishing step S8 is performed after the functional layer securing step S5. In the repetition finishing step S8, whether the number of sequential repetitions is finished or not is selected. According to selection in the repetition finishing step S8, an additional functional layer M may be formed, a substrate separation step S9 may be performed, or the method for manufacturing a three-dimensional structure through nano-imprinting according to the embodiment of the invention may be finished.

More specifically, in the repetition finishing step S8, if the manufacturing process is not completed corresponding to the number of sequential repetitions, the method returns to the stamp preparation step S1 such that the material 4 is additionally stacked on the substrate B to form an additional functional layer M.

In addition, if the manufacturing process is completed corresponding to the number of sequential repetitions in the repetition finishing step S8, the substrate separation step S9 described below may be performed. Alternatively, if the manufacturing process is completed corresponding to the number of sequential repetitions in the repetition finishing step S8, the manufacturing process according to the embodiment may be completed.

The method for manufacturing a three-dimensional structure through nano-imprinting according to the embodiment may further include a substrate installation step S1-1 and the substrate separation step S9.

The substrate installation step S1-1 is performed prior to the material formation step. In the substrate installation step S1-1, the substrate B is prepared such that an initial functional layer M can be detachably attached thereto. Here, in the substrate installation step S1-1, the substrate B may be washed or subjected to surface treatment.

The substrate installation step S1-1 is performed once and is not repeated.

Through washing or surface treatment of the substrate B, bonding strength between the substrate B and the material 4 or between the substrate B and the functional layers M can be regulated.

In addition, the substrate installation step S1-1 may allow simplification of the substrate separation step S9 and prevent damage to the functional layers M separated from the substrate B.

In the substrate installation step S1-1, a bonding layer may be coated onto the substrate B. The bonding layer coated onto the substrate can provide substantially the same effect as that obtained by washing or surface treating the substrate B.

In the substrate separation step S9, after all of the functional layers M are stacked and secured corresponding to the stacked structure of the functional layers M, the functional layers M are separated from the substrate B. In the substrate separation step S9, the functional layers M are separated from the substrate B, thereby providing a completed three-dimensional structure. In the substrate separation step S9, since the number of repetitions is completed in the repetition finishing step S8, the functional layers M can be separated from the substrate B.

In the substrate separation step S9, the three-dimensional structure may be cut to a predetermined size using a cutter having various shapes.

The three-dimensional structure obtained by the manufacturing method described above is composed of the functional layers M separated from the substrate B. In addition, the three-dimensional structure obtained by the manufacturing method described above may be applied to any one of an ultra-lightweight high strength metal complex material, a water treatment filter, an air purification filter, a construction interior/exterior material, a structural color material, and a hologram material.

Here, each of the functional layers M is formed with a plurality of holes H corresponding to the pattern thereof. In addition, the plurality of functional layers M may be integrated with each other by at least one of pressure, a combination of heat and pressure and a combination of light and pressure described above and may be formed with the holes H to reduce the weight of the three-dimensional structure.

It should be understood that the present invention is not limited to a particular process in washing or surface treatment and any process may be used so long as the process allows materials to be easily separated from a matrix. For example, any process may be used so long as the process facilitates attachment or detachment between the stamp 1 and the material 4, attachment or detachment between the substrate B and the material 4, or attachment or detachment between the substrate B and the functional layers M.

According to another embodiment, the method may further include a cutting step S5' in which some portions of the functional layers are cut after the functional layer securing step S5.

FIG. 9 is a flowchart of a cutting step in a method for manufacturing a three-dimensional structure through nano-imprinting according to another embodiment of the present invention, and FIG. 10 and FIG. 11 show the cutting step in the method for manufacturing a three-dimensional structure through nano-imprinting according to another embodiment of the present invention. Here, FIG. 10 is a sectional view illustrating the cutting step and FIG. 11 is a plan view illustrating the cutting step.

Referring to FIG. 9 to FIG. 11, in the cutting step S5', some portions of the functional layers M cured in the functional layer securing step S5 are cut to allow the functional layers M to be patterned corresponding to a predetermined shape. That is, each of the functional layers M constituting the three-dimensional structure is cut to a predetermined shape and stacked one above another, thereby enabling easy formation of the three-dimensional structure.

For example, in the cutting step S5', a laser beam (not shown) is emitted toward the functional layers M from above the functional layers M to allow the cured functional layers M to be patterned to a first cutting line L1 corresponding to a preset shape. Here, in the cutting step S5', some portions M' of the functional layers M may be removed from the functional layers M after the functional layers M are patterned along the first cutting line L1 before the repetition finishing step S8. Alternatively, some portions M' may be removed from the functional layers M after completion of the repetition finishing step S8.

On the other hand, in order to allow some portions M' to be easily removed from the functional layers M, a second cutting line L2 may be formed on some portions M' by a laser beam. For example, the second cutting line L2 may be provided in a lattice shape. Accordingly, even when the three-dimensional structure has a complicated three-dimensional shape, some portions M' of the functional layers can be easily removed therefrom.

On the other hand, although a laser beam is provided as a means for cutting the functional layers M in the cutting step S5', it should be understood that the present invention is not limited thereto and various means capable of cutting the functional layers M may also be used.

In the manufacturing method according to the present invention, the functional layers M patterned to a thickness of several to dozens of nanometers through nano-imprinting are stacked one above another, thereby enabling easy formation of a high strength, ultra-lightweight and highly functional three-dimensional structure. In addition, the manufacturing method according to the present invention allows the materials 4 to be formed in a nanometer scale on the stamp 1, thereby allowing easy patterning of the functional layers M while preventing sagging or distortion of the pattern of the functional layers M.

Further, the manufacturing method according to the present invention can improve accuracy of the pattern formed on the functional layers and can facilitate stacking and bonding between the functional layers having the pattern thereon. Further, the manufacturing method according to the present invention allows change of the stacked structure of the functional layers in various ways depending upon the kind of pattern to be formed and can improve structural accuracy of the functional layers.

Further, the manufacturing method according to the present invention allows stable separation of the materials 4 from the stamp 1 and integration of the stacked materials 4, thereby enabling stable formation of the functional layers. Further, the manufacturing method according to the present invention can prevent contamination of the materials 4 by the stamp 1 and deformation or damage to the stamp 1 due to repeated use of the stamp 1.

Further, the manufacturing method according to the present invention can allow easy attachment or detachment between the substrate B and the functional layers M while allowing stable separation of the functional layers M from the substrate B without damage to the functional layers M, thereby stabilizing the stacked structure of the three-dimensional structure. Further, the manufacturing method according to the present invention can enhance bonding strength between the materials 4 stacked one above another by at least one of pressure, a combination of heat and pressure and a combination of light and pressure and can improve strength and conductivity (electrical or thermal conductivity) of the completed three-dimensional structure.

Further, the manufacturing method according to the present invention can allow stable attachment of the materials 4 to the convex-concave portion 11 of the stamp 1 and stable adjustment of thicknesses of the materials 4 attached to the convex-concave portion 11.

Further, the manufacturing method according to the present invention can provide fine filtering effects to the three-dimensional structure while reducing the weight of the three-dimensional structure through holes H formed in the functional layers M stacked one above another, and can allow the completed three-dimensional structure to exhibit inherent optical characteristics thereof. Further, the manufacturing method according to the present invention can realize a mechanical or electromagnetic metamaterial through the three-dimensional structure.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention.

- List of Reference numerals -

| | |
|---|---|
| S1: Stamp preparation step | S1-1: Substrate installation step |
| S2: Release layer formation step | S3: Material formation step |
| S4: Material stacking step | S5: Functional layer securing step |
| S6: Repetition controlling step | S7: Stamp processing step |
| S8: Repetition finishing step | S9: Substrate separation step |
| 1: stamp | 1a: base |
| 1b: remaining layer | 11: convex-concave portion |
| 2: master | 3: release layer |
| 4: material | 4a: first material |
| 4b: second material | M: functional layer |
| B: substrate | H: hole |

The invention claimed is:

1. A method for manufacturing a three-dimensional structure through nano-imprinting, comprising:
   a stamp preparation step in which a stamp formed with a convex-concave portion corresponding to a pattern of functional layers to be formed is prepared;
   a release layer formation step in which a release layer is formed on a surface of the stamp;
   a material formation step in which at least one material for forming the functional layers is formed to a thickness of 1 nm to 100 nm on the convex-concave portion;
   a material stacking step in which the material formed on the convex-concave portion is stacked on a substrate; and
   a functional layer securing step in which the material is cured by applying pressure, heat and pressure, or light and pressure thereto such that the material can be converted into the functional layers,
   wherein the stamp preparation step, the release layer formation step, the material formation step, the material stacking step, and the functional layer securing step are sequentially repeated corresponding to a stack structure of the functional layers.

2. The method according to claim 1, further comprising: a cutting step in which the functional layers are cut, after the functional layer securing step.

3. The method according to claim 1, further comprising:
   a repetition controlling step in which a kind of pattern is determined corresponding to the stack structure of the functional layers and the number of sequential repetitions is determined; and
   a stamp processing step in which the convex-concave portion is formed on the stamp corresponding to the pattern determined in the repetition controlling step.

4. The method according to claim 3, further comprising:
   a repetition finishing step in which whether the number of sequential repetitions is finished or not is selected after the functional layer securing step,
   wherein, if the number of sequential repetitions is not finished, the manufacturing method returns to the stamp preparation step.

5. The method according to claim 1, further comprising:
   a substrate installation step in which the substrate is prepared to allow an initial functional layer to be detachably attached thereto, before the material formation step; and
   a substrate separation step in which the functional layers are separated from the substrate, after all of the functional layers are stacked and secured corresponding to the stacked structure of the functional layers.

6. The method according to claim 1, wherein the stamp is formed of an organic material, an inorganic material or a composite of organic/inorganic materials and comprises a remaining layer on which the convex-concave portion is formed, and the material for forming the functional layers is composed of materials at upper and lower sides such that the material at the upper side is bonded to the material at the lower side upon application of at least one of pressure, a combination of heat and pressure and a combination of light and pressure thereto.

7. The method according to claim 1, wherein the convex-concave portion is formed on the surface of the stamp in at least one shape selected from the group consisting of a line shape, an island shape, a lattice shape, and a combination thereof.

8. The method according to claim 1, wherein, in the material formation step, the material is formed on the convex-concave portion by at least one of chemical vapor deposition, physical vapor deposition, sputtering, spray printing, inkjet printing, and screen printing.

9. The method according to claim 1, wherein the stamp is formed of a transparent material and, in the functional layer securing step, the material is irradiated with UV light or visible light having passed through the stamp such that the material at an upper side is bonded to the material at a lower side, while the stamp compresses the material so as to maintain a stacked structure of the material.

* * * * *